US007003273B1

(12) United States Patent
Shimanuki et al.

(10) Patent No.: US 7,003,273 B1
(45) Date of Patent: Feb. 21, 2006

(54) TEMPERATURE COMPENSATING CIRCUIT, ELECTRONIC APPARATUS AND RADIO UNIT HAVING TEMPERATURE COMPENSATING FUNCTION

(75) Inventors: Masanobu Shimanuki, Yokohama (JP); Taku Hatsukano, Hino (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 704 days.

(21) Appl. No.: 09/598,249

(22) Filed: Jun. 21, 2000

(30) Foreign Application Priority Data

Jun. 22, 1999 (JP) ................................ 11-175574
Jun. 16, 2000 (JP) ............................ 2000-181710

(51) Int. Cl.
*H04B 1/06* (2006.01)
*H04B 7/00* (2006.01)

(52) U.S. Cl. .................. 455/255; 455/316; 455/196.1; 455/113; 455/71; 331/66; 331/70; 331/176

(58) Field of Classification Search ................ 455/255, 455/24, 62, 66.1, 71, 119; 331/66, 69, 70, 331/176; 326/32; 327/83, 138, 262, 378, 327/513
See application file for complete search history.

(56) References Cited

U.S. PATENT DOCUMENTS 4,611,181 A * 9/1986 Fukumura et al. ............ 331/66
4,746,879 A * 5/1988 Ma et al. ...................... 331/44
5,777,524 A * 7/1998 Wojewoda et al. ..... 331/116 R
5,875,388 A * 2/1999 Daughtry et al. ........ 455/67.11
6,026,278 A * 2/2000 Suzuki ...................... 340/7.34
6,226,505 B1 * 5/2001 Uda ........................... 455/255
6,278,867 B1 * 8/2001 Northcutt et al. ........... 455/255

FOREIGN PATENT DOCUMENTS

JP 4-236517 * 8/1992
JP 8-265044 * 10/1996
JP 9-307355 * 11/1997
JP 09307355 * 11/1997

* cited by examiner

*Primary Examiner*—Stephen D'Agosta
(74) *Attorney, Agent, or Firm*—Finnegan, Henderson, Farabow, Garrett & Dunner, L.L.P.

(57) ABSTRACT

A temperature compensating circuit is provided in a radio unit, an ambient temperature is detected by a temperature sensor of the temperature compensating circuit, the detected temperature value is supplied to a correction address storage section as an address after it is converted to a digital value, and thus a correction address corresponding to a correct temperature value obtained by correcting the detected temperature value is read out. Then, the correction address is supplied to a frequency correction data storage section to read out frequency correction data corresponding to the corrected temperature value, and the frequency correction data is converted to an analog control voltage by a D/A converter and then supplied to a variable capacitance element of a reference oscillator, thereby making it possible to correct the reference oscillation frequency according to the temperature.

8 Claims, 10 Drawing Sheets

TEMPERATURE COMPENSATING CIRCUIT, ELECTRONIC APPARATUS AND RADIO UNIT HAVING TEMPERATURE COMPENSATING FUNCTION

CROSS-REFERENCE TO RELATED APPLICATIONS

This application is based upon and claims the benefit of priority from the prior Japanese Patent Applications No. 11-175574, filed Jun. 22, 1999; and No. 2000-181710, filed Jun. 16, 2000, the entire contents of which are incorporated herein by reference.

BACKGROUND OF THE INVENTION

This invention relates to a temperature compensating circuit for compensating the operation of an electronic circuit such as an oscillation circuit having a temperature characteristic, for example, and an electronic device and radio unit having a temperature compensating function.

Generally, in an electronic device constructing a terminal device or a base station for mobile communication, an oscillation circuit such as a synthesizer is provided. This type of oscillation circuit generally uses a reference oscillator including a quartz oscillator. The quartz oscillator generally has a temperature characteristic which exhibits a cubic curve, for example. Therefore, in order to attain stable oscillation frequencies, it is indispensable to correct the operation of the oscillation circuit while taking the temperature characteristic of the quartz oscillator into consideration.

In the prior art, for example, an oscillation circuit having a temperature correcting or compensating function and using a thermostatic device which is called a temperature compensated crystal oscillator (TCXO) as the quartz oscillator is used. However, since the quartz oscillator using the thermostatic device is generally large and expensive, the size of the oscillation circuit will become large and the cost thereof will be high.

An oscillation circuit for correcting the oscillation frequency according to a variation in temperature by changing the bias voltage of the oscillation circuit by use of a combination of a temperature sensor such as a thermistor and a variable capacitance element is known. Since this type of circuit does not use an expensive quartz oscillator, the cost of the oscillator circuit is lowered and the size thereof can be made small. However, in the oscillation circuit using the temperature sensor to attain temperature compensation, it is difficult to attain precise temperature compensation over a wide temperature range due to an influence of the detection error of the temperature sensor and a variation thereof and, as a result, a stable oscillation circuit cannot be provided.

BRIEF SUMMARY OF THE INVENTION

This invention has been made in view of the above problem and an object of this invention is to provide a temperature correcting or compensating circuit for reducing an influence of the detection error of a temperature sensor and a variation in the detection characteristic, thereby making it possible to attain highly precise temperature correction or compensation over a wide temperature range and an electronic device having a temperature correction or compensation function.

In order to attain the above object, a temperature compensating or correcting circuit according to this invention comprises temperature detecting means for detecting an ambient temperature of an electronic circuit which is a to-be-corrected object; and temperature compensation control means. The temperature compensation control means includes second storage means for storing second correction data formed for correcting a temperature characteristic of the electronic circuit based on the temperature characteristic, first storage means for storing first correction data formed for correcting a detection error contained in a detection characteristic of the temperature detecting means based on the detection characteristic, and correction processing means. The correction processing means is constructed to correct the operation of the electronic circuit based on the ambient temperature detected by the temperature detecting means, the first correction data stored in the first storage means and the second correction data stored in the second storage means.

Further, an electronic device according to this invention comprises an electronic circuit having a temperature characteristic; a temperature detecting circuit for detecting an ambient temperature of the electronic circuit; and a temperature compensating circuit; the temperature compensating circuit includes a second storage section for storing second correction data formed based on the temperature characteristic of the electronic circuit and a first storage section for storing first correction data for correcting a detection error of the temperature detecting circuit with respect to an actual temperature and the operation of the electronic circuit is corrected based on the ambient temperature detected by the temperature detecting circuit, the first correction data stored in the first storage section and the second correction data stored in the second storage section.

Therefore, according to this invention, even if the temperature detecting means has the detection error and the detected temperature contains a detection error, the detected temperature is corrected based on the first correction data and the operation of the electronic circuit is corrected based on the corrected detected temperature. Thus, the operation of the electronic circuit is precisely corrected according to the ambient temperature and, as a result, highly precise temperature correction can be attained over a wide temperature range. In addition, since an expensive circuit element using a thermostatic element is not necessary and the precise adjusting operation is not required, the cost of the electronic device can be lowered.

As the concrete construction of the temperature compensation control means, the following constructions can be considered.

In the first construction, corrected temperatures derived for a plurality of temperatures over an entire temperature range to be corrected in the detection characteristic of the temperature detecting means are stored in the first storage means, a corrected temperature corresponding to an ambient temperature detected by the temperature detecting means is selectively read out from the first storage means in the correction processing means and the operation of the electronic circuit is corrected based on the readout corrected temperature and the second correction data stored in the second storage means.

With the above construction, the temperature detected by the temperature detecting means can be precisely corrected according to the detection characteristic of the temperature detecting means irrespective of the type of the detection characteristic.

In the second construction, a difference between an actually measured temperature for one desired representative temperature contained in an entire temperature range to be corrected in the detection characteristic of the temperature detecting means and an expected temperature thereof is derived and corrected temperatures derived for a plurality of temperatures in the entire temperature range based on the difference are stored in the first storage means. In the correction processing means, a corrected temperature corresponding to an ambient temperature detected by the temperature detecting means is selectively read out from the first storage means and the operation of the electronic circuit is corrected based on the readout corrected temperature and the second correction data stored in the second storage means.

With the above construction, it is not necessary to actually measure the detection temperature while changing the ambient temperature at 1° C. intervals over the entire temperature range and it is only required to actually measure the temperature by use of the temperature detecting means only for the representative temperature. Therefore, it becomes possible to easily set the first correction data in a short period of time.

In the third construction, difference data between an actually measured temperature for one desired representative temperature contained in an entire temperature range to be corrected in the detection characteristic of the temperature detecting means and an expected temperature thereof is stored in the first storage means. In the correction processing means, a corrected temperature corresponding to an ambient temperature detected by the temperature detecting means is derived based on the detected ambient temperature and the difference data stored in the first storage means and the operation of the electronic circuit is compensated based on the corrected temperature and the second correction data stored in the second storage means.

With the above construction, since only the difference data between the expected temperature and the detected temperature derived for the representative temperature is stored in the first storage means, the storage capacity of the first storage means can be greatly reduced, thereby making it possible to reduce the size of the circuit scale of the temperature compensating circuit. This effect is extremely important in an electronic device, for example, a mobile communication device such as a portable telephone in which a reduction in the size and weight thereof is dealt with as one of the most important subjects.

In the fourth construction, an entire temperature range to be corrected in the detection characteristic of the temperature detecting means is divided into a plurality of temperature ranges and difference data items between actually measured temperatures for desired representative temperatures which are each contained in a corresponding one of the divided temperature ranges and respective expected temperatures thereof are derived and corrected temperatures derived for a plurality of temperatures contained in the respective divided temperature ranges based on the difference data items are stored in the first storage means. In the correction processing means, a corrected temperature corresponding to an ambient temperature detected by the temperature detecting means is selectively read out from the first storage means and the operation of the electronic circuit is corrected based on the readout corrected temperature and the second correction data stored in the second storage means.

With the above construction, even if a temperature sensor having a nonlinear detection characteristic is used, the detection error can be effectively corrected. Further, when correction data is stored into the first storage means, it is only necessary to actually measure temperatures only for the representative temperatures for the respective divided temperature ranges by use of the temperature detecting means. Therefore, it becomes possible to easily set the first correction data in a short period of time.

In the fifth construction, an entire temperature range to be corrected in the detection characteristic of the temperature detecting means is divided into a plurality of temperature ranges and difference data items between actually measured temperatures for desired representative temperatures which are each contained in a corresponding one of the divided temperature ranges and respective expected temperatures thereof are stored in the first storage means. In the correction processing means, a corrected temperature corresponding to an ambient temperature detected by the temperature detecting means is derived based on the detected ambient temperature and the difference data corresponding to one of the divided temperature ranges in which the detected ambient temperature is contained and stored in the first storage means and the operation of the electronic circuit is corrected based on the corrected temperature and the second correction data stored in the second storage means.

With the above construction, like the fourth construction, even if a temperature sensor having a nonlinear detection characteristic is used, the detection error can be effectively corrected and the first correction data can be easily set in a short period of time. In addition, since only the difference data items between the expected temperatures and the detected temperatures derived for the representative temperatures are stored in the first storage means, the storage capacity of the first storage means can be greatly reduced, thereby making it possible to reduce the size of the circuit scale of the temperature compensating circuit.

Further, according to this invention, corrected temperatures obtained by correcting detection errors of the detected temperatures output from the temperature detecting means are stored in correspondence to the respective detected temperatures in the first storage means and operation correction data items each for correcting the operation of the electronic circuit when a corresponding one of the corrected temperatures is obtained are stored in correspondence to the respective corrected temperatures in the second storage means. In the correction processing means, the detected temperature output from the temperature detecting means is supplied to the first storage means as an address to read out a corresponding corrected temperature, the readout corrected temperature is supplied to the second storage means as an address to read out corresponding operation correcting data and the operation of the electronic circuit is corrected based on the readout operation correcting data.

With the above construction, since the temperature compensation control circuit can be constructed by use of a hardware circuit using a memory table, it becomes possible to provide a circuit which is simple in construction and excellent in the response characteristic.

In a case where the electronic device has a radio unit having an oscillation circuit and a control circuit for controlling the operation of the radio unit, the temperature detecting circuit is provided in the radio unit and the temperature compensating circuit is provided in the control circuit. A signal for temperature-correcting the operation of the oscillation circuit is generated based on the ambient temperature output from the temperature detecting circuit and the first and second correction data items stored in the internal memory of the control circuit by use of the temperature compensating circuit in the control circuit and then supplied to the oscillation circuit.

With the above construction, the frequency generated from the oscillation circuit of the radio unit can be precisely maintained over a wide temperature range even if the ambient temperature is changed or the temperature detecting circuit has a detection error or a variation in the detection characteristic. Further, the temperature compensation control function can be attained by use of the control circuit which is already provided for generally controlling the operation of the radio unit. Therefore, it is not necessary to newly provide an independent temperature compensating circuit and the electronic device can be made simple in circuit construction and small in size.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

First Embodiment

Figure 1:
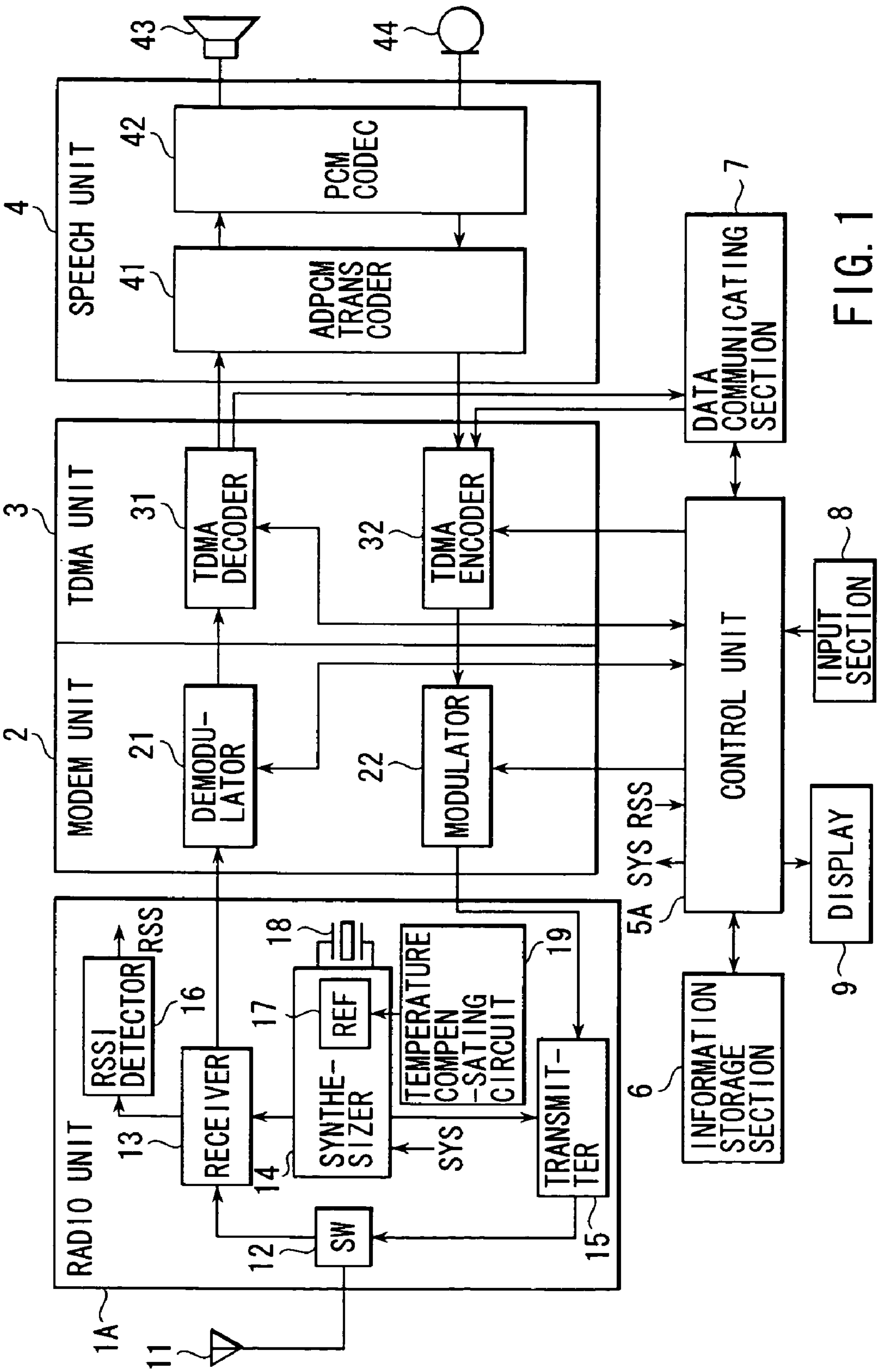
FIG. 1 is a block diagram showing the construction of a PHS terminal with the temperature compensating function which is a first embodiment of an electronic device according to this invention.

FIG. 1 is a block diagram showing the construction of a personal handyphone system (PHS) terminal which is a first embodiment of an electronic device having a temperature compensating function according to this invention.

The PHS terminal includes a radio unit 1A having an antenna 11, modem unit 2, time division multiple access (TDMA) unit 3, communication unit 4, control unit 5A, information storage section 6, data communication section 7, input section 8 having a key pad, for example, and display section 9 using a liquid crystal display (LCD), for example.

A radio carrier signal transmitted from a base station (not shown) is received by the antenna 11 and then input to a receiving section 13 via a high-frequency switch (SW) 12 of the radio unit 1A. In the receiving section 13, the received radio carrier signal is mixed with a local oscillation signal generated from a synthesizer 14 and down-converted to a received intermediate-frequency signal.

The frequency of the local oscillation signal generated from the frequency synthesizer 14 is set to a value corresponding to the radio channel frequency and specified by the control unit 5A. In the radio unit 1A, a received electric field intensity detector (RSSI detector) 16 is provided. In the RSSI detector 16, the received electric field intensity of the radio carrier signal transmitted from the base station is detected and the detected value is supplied to the control unit 5A to determine and display the reception quality, for example.

The received intermediate-frequency signal output from the receiving section 13 is input to a demodulating section 21 of the modem unit 2. In the demodulating section 21, the received intermediate-frequency signal is demodulated in a digital form to reproduce a digital demodulation signal.

A TDMA decoding section 31 of the TDMA unit 3 separates the digital demodulation signal for each reception time slot. If data of the separated slot is voice data, the voice data is input to the communication unit 4. If data of the separated slot is packet data or control data, the data is input to the data communication section 7.

The communication unit 4 includes an adaptive differential pulse code modulation (ADPCM) transcoder 41, PCM codec 42, speaker 43, and microphone 44. The ADPCM transcoder 41 decodes voice data output from the TDMA decoding section 31. The PCM codec 42 converts a digital voice signal output from the ADPCM transcoder 41 into an analog signal and amplifies and outputs the voice signal via the speaker 43.

The data communication section 7 receives data supplied from the TDMA decoding section 31 and supplies the received data to the control unit 5A. If the received data is control data, the control unit 5A analyzes the control data and effects the necessary control operation. On the other hand, if the received data is packet data transmitted from a server or the like, it de-packets the packet data, stores the de-packetted data into the information storage section 6, at the same time, supplies and displays the de-packetted data to and on the display section 9.

The voice signal of the user input to the microphone 44 is PCM-coded in the PCM codec 42 and then compression-coded by the ADPCM transcoder 41. Further, the coded voice data is input to a TDMA encoding section 32. Control data or packet data output from the control unit 5A is input to the TDMA encoding section 32 via the data communication section 7.

The TDMA encoding section 32 inserts the digital voice data of each channel output from the ADPCM transcoder 41 and control data or packet data output from the data communication section 7 into transmission time slots specified by the control unit 5A to multiplex them. The modulating section 22 modulates the transmission intermediate-frequency signal in a digital form by use of a multiplexed digital communication signal output from the TDMA encoding section 32 and inputs the modulated transmission intermediate-frequency signal to a transmitting section 15.

The transmitting section 15 mixes the modulated transmission intermediate-frequency signal with a local oscillation signal generated from the synthesizer 14 to up-convert the same to a radio carrier frequency signal and amplify the same to a preset transmission power level. The radio carrier frequency signal output from the transmission section 15 is transmitted towards a base station (not shown) from the antenna 11 via the high-frequency switch 12.

A PHS terminal according to the present embodiment includes a temperature compensating circuit 19 in the radio unit 1A in order to correct the oscillation frequency of a reference oscillator (REF) 17 provided in the synthesizer 14 according to the ambient temperature.

Figure 2:
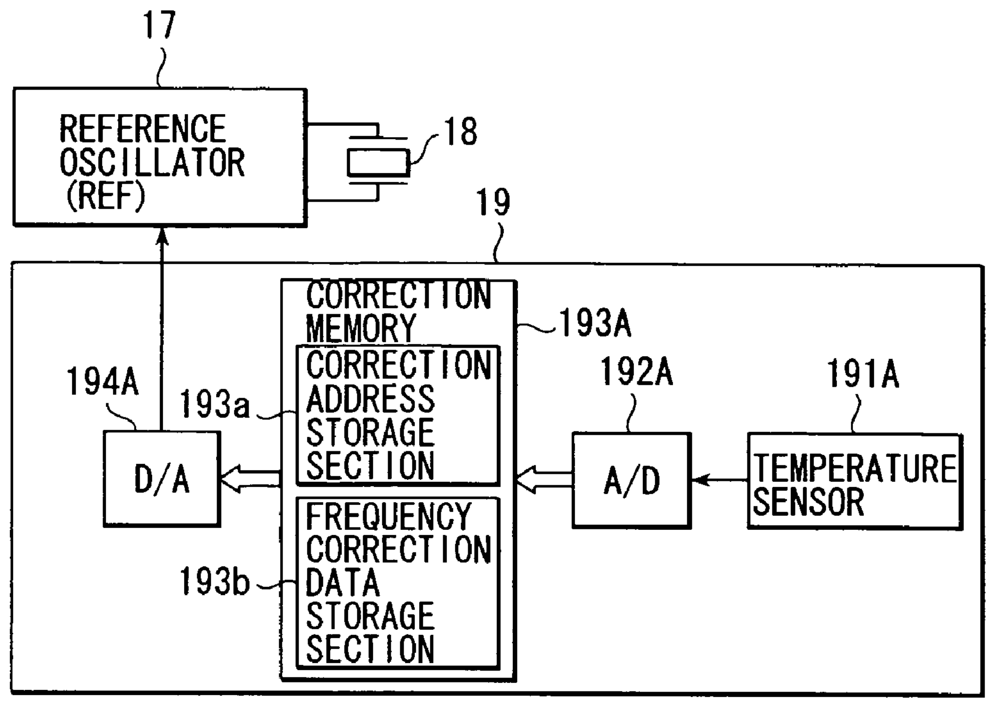
FIG. 2 is a block diagram showing the construction of a temperature compensating circuit which is a main portion of the PHS terminal shown in FIG. 1.

FIG. 2 is a block diagram showing the construction of the temperature compensating circuit 19 which includes a temperature sensor 191A, analog/digital converter (A/D) 192A, correction memory 193A, and digital/analog converter (D/A) 194A.

Figure 3:
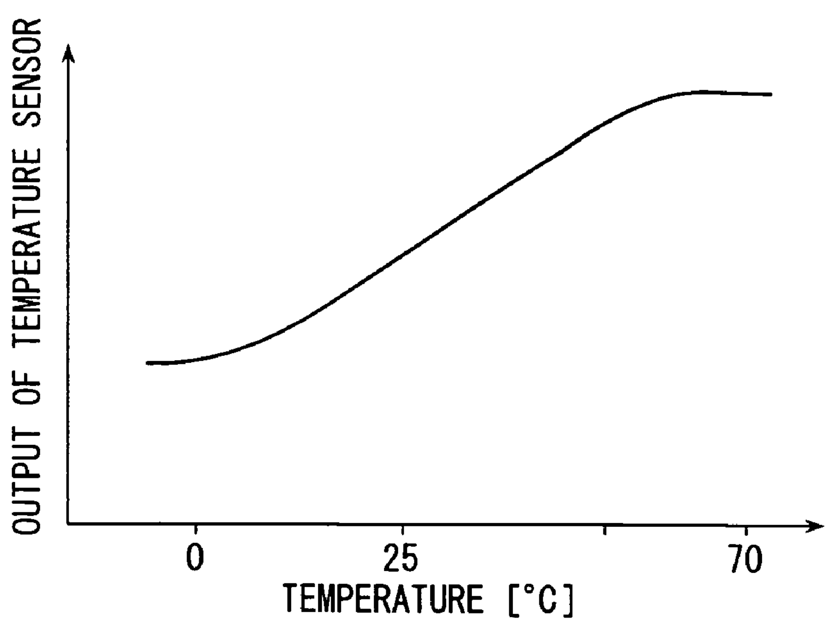
FIG. 3 is a diagram showing one example of the detection characteristic of a temperature sensor used in the temperature compensating circuit shown in FIG. 2.

The temperature sensor 191A uses a semiconductor temperature sensor, for example, and outputs a voltage value which varies with the ambient temperature as a temperature detection signal. FIG. 3 shows one example of the detection characteristic of the temperature sensor 191A. The A/D converter 192A converts the temperature detection signal output from the temperature sensor 191A to a digital value and supplies the temperature detection signal as an address to the correction memory 193A.

The correction memory 193A includes a correction address storage section 193*a* and frequency correction data storage section 193*b*. Among them, the frequency correction data storage section 193*b* stores frequency correction data items in correspondence to temperature values which are set at 1° C. intervals in an ambient temperature variation range (for example, 0° C. to 70° C.) which is assumed to be used. The frequency correction data is formed to correct the oscillation frequency of the reference oscillator 17 according to the temperature.

The correction address storing section 193*a* stores corrected temperatures as correct addresses. The corrected temperatures are correct ambient temperatures obtained by correcting measured temperatures for the respective measured temperatures in the entire measured temperature range by the temperature sensor 191A.

Figure 4:
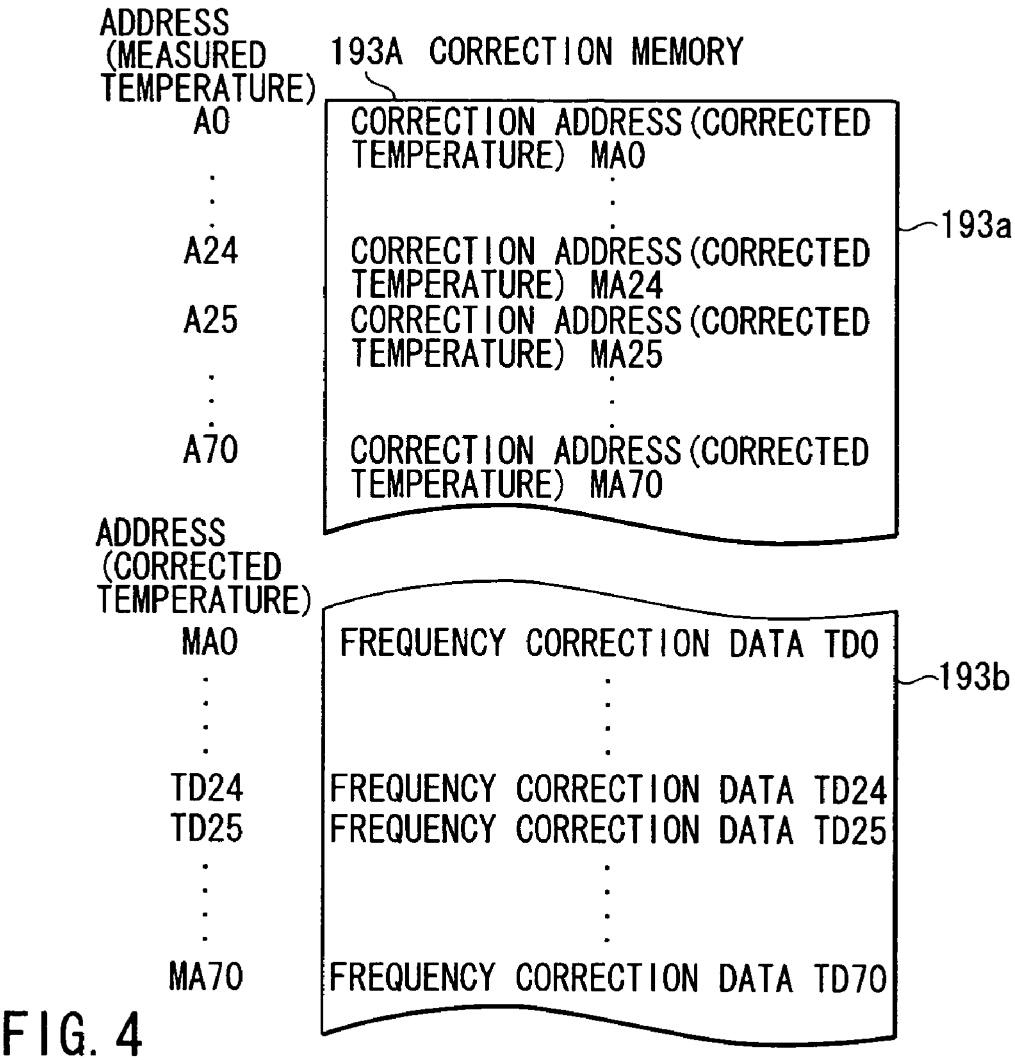
FIG. 4 is a diagram showing the construction of a correction memory provided in the temperature compensating circuit shown in FIG. 2.

FIG. 4 shows one example of the construction of the correction address storage section 193*a* and frequency correction data storage section 193*b*. The detected temperature values of the temperature sensor 191A which are supplied from the A/D converter 192A are set to correspond to addresses A0 to A70 of the correction address storing section 193*a* and correct temperature values obtained by correcting the detected temperature values are stored in the storage areas expressed by the addresses A0 to A70.

The corrected temperatures stored in the correction address storage section 193*a* are set to correspond to addresses MA0 to MA70 of the frequency correction data storage section 193*b* and frequency correction data items TD0 to TD70 are stored in the storage areas expressed by the addresses MA0 to MA70.

Figure 5:
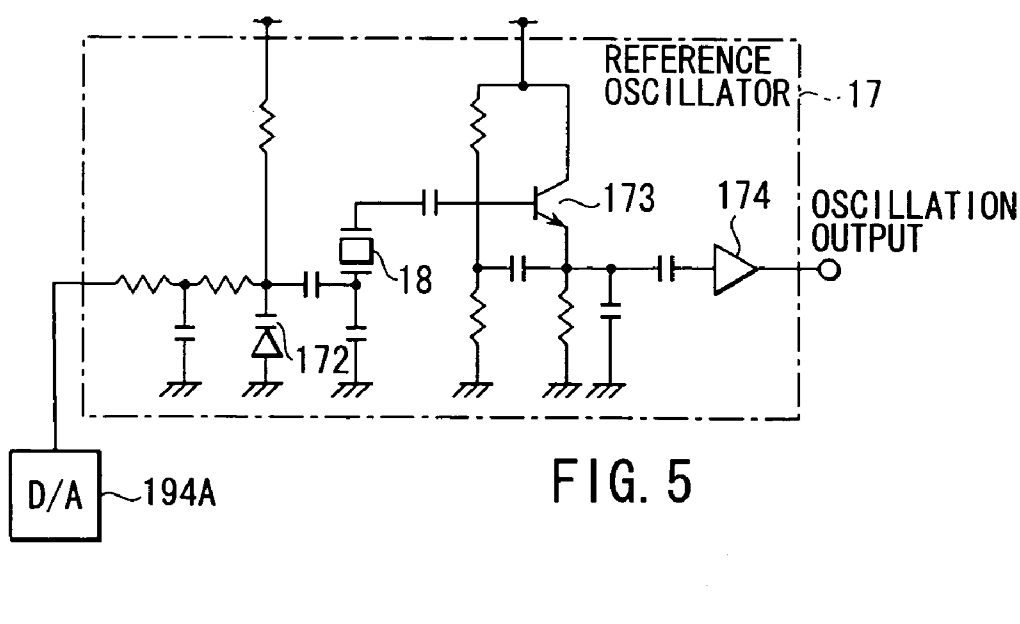
FIG. 5 is a circuit diagram showing one example of the construction of a reference oscillator.

FIG. 5 shows one example of the construction of the reference oscillator 17 which is constructed together with a quartz oscillator 18. To the quartz oscillator 18, an energization circuit having a variable capacitance element 172 is connected. The energization circuit energizes the quartz oscillator 18 according to a control voltage supplied from the temperature compensating circuit 19 so as to attain the oscillating operation. A transistor oscillation circuit 173 generates a reference oscillation frequency signal based on the oscillation output of the quartz oscillator 18 and outputs the reference oscillation frequency signal from a buffer 174.

Next, the temperature correcting operation by use of the circuit with the construction described above is explained.

The operation for writing frequency correction data and correction addresses into the frequency correction data storage section 193*b* and correction address storage section 193*a* of the correction memory 193A is effected in the manufacturing process of the radio unit 1A.

That is, first, correction data items TD0 to TD70 of the oscillation frequencies are derived at 1° C. intervals in a temperature variation range (for example, 0° C. to 70° C.) which is assumed to be used based on the rated value of the oscillation characteristic of the quartz oscillator 18 and the frequency correction data items TD0 to TD70 are written into the frequency correction data storage section 193*b*.

Next, an external setting device such as a personal computer is connected to the temperature compensating circuit 19. Then, while the ambient temperature is being changed at 1° C. intervals in the temperature variation range (0° C. to 70° C.) which is assumed to be used, a detection output of the temperature sensor 191A for each temperature is output to the external setting device via the A/D converter 192A and measured. Corrected temperatures are derived based on differences between the measured temperatures and the actual ambient temperatures (expected temperatures) and the addresses MA0 to MA70 of the frequency correction data storage section 193*b* in which frequency correction data items corresponding to the corrected temperatures are stored are written into the correction address storage section 193*a* in correspondence to the addresses A0 to A70 for the respective measured temperatures.

That is, in the correction address storage section 193*a*, the corrected temperatures derived based on the actually measured temperature values by use of the temperature sensor 191A for the respective temperatures over the entire temperature variation range (0° C. to 70° C.) which is assumed to be used are stored as the correction addresses MA0 to MA70.

Assume now that the PHS terminal is used under a certain environmental condition. Then, the ambient temperature of the reference oscillator 17 at this time is detected by the temperature sensor 191A of the temperature compensating circuit 19 and the measured temperature value is converted into a digital value by the A/D converter 192A and then supplied to the correction address storage section 193*a* of the correction memory 193 as one of the addresses A0 to A70. As a result, one of the correction addresses MA0 to MA70 corresponding to the correct ambient temperature value which is obtained by correcting the measured temperature value is read out from the correction address storage section 193*a* and the corresponding one of the correction addresses MA0 to MA70 is supplied to the frequency correction data storage section 193*b* as an address. As a result, frequency correction data corresponding to the correct ambient temperature value supplied as one of the correction addresses MA0 to MA70 is read out from the frequency correction data storage section 193*b* and the frequency correction data is converted into an analog signal by the D/A converter 194A and then supplied to the reference oscillator 17.

For example, assume now that the temperature value detected by the temperature sensor 191A is 25° C. and the actual temperature (expected temperature) at this time is 24° C. which is lower by 1° C. In this case, in the storage area of the correction address storage section 193*a* for the address A25, a correction address MA25 for the actual temperature 24° C. which is the correct temperature value after correction is previously stored. Therefore, at this time, if the digital signal of the measured temperature 25° C. is supplied to the correction address storage section 193*a* as the address A25, the correction address MA25 corresponding to the actual temperature 24° C. which is the correct temperature value after correction is read out from the error correction data storage section 193*a*.

The correction address MA25 is supplied to the frequency correction data storage section 193*b* as the address and frequency correction data TD24 for the actual temperature 24° C. which is the correct temperature value is read out from the frequency correction data storage section 193*b*. Then, an analog control voltage corresponding to the frequency correction data TD24 is output from the D/A converter 194A and supplied to the reference oscillator 17.

Thus, in the reference oscillator 17, the capacitance of the variable capacitance element 172 is changed according to the value of the analog control voltage and, as a result, a reference oscillation frequency which is corrected (or compensated for) according to the temperature is output from the transistor oscillation circuit 173.

As described above, in the first embodiment, the temperature compensating circuit 19 is provided in the radio unit 1A, the ambient temperature is detected by the temperature sensor 191A in the temperature compensating circuit 19, the detected temperature value is converted into a digital value which is in turn supplied to the correction address storage section 193*a* as an address and a corresponding one of the correction addresses MA0 to MA70 for the correct temperature value obtained by correcting the measured temperature value is read out. Then, the corresponding one of the correction addresses MA0 to MA70 is supplied to the frequency correction data storage section 193*b* to read out frequency correction data corresponding to the corrected temperature value and the frequency correction data is converted to an analog control voltage by the D/A converter 194A and then supplied to the variable capacitance element 172 of the reference oscillator 17, thereby temperature-correcting the reference oscillation frequency.

Therefore, even if the temperature sensor 191A has a detection error and a variation in the detection characteristic and an error component due to the detection error and variation is contained in the detected temperature value, the detected temperature value is corrected to a correct temperature value in the correction address storage section 193*a* and the reference oscillation frequency is corrected based on the frequency correction data corresponding to the corrected temperature value. Thus, the reference oscillation frequency can be precisely temperature-corrected irrespective of the detection error and variation which the temperature sensor 191A has and, as a result, the reference oscillation frequency generated from the reference oscillator 17 can be kept extremely stable. Further, since it is not necessary to use an expensive oscillator with a temperature correction function, an inexpensive PHS terminal can be provided.

Further, in the first embodiment, the corrected temperatures are derived based on the actually measured temperature values by use of the temperature sensor 191A for the respective temperatures over the entire temperature variation range (0° C. to 70° C.) which is assumed to be used and the corrected temperatures are stored in the correction address storage section 193*a* as the correction addresses. Therefore, even if the temperature sensor 191A has an inherent variation, the detection characteristic thereof can be precisely corrected over the entire temperature variation range (0° C. to 70° C.).

Further, in the first embodiment, since the temperature sensor 191A, A/D converter 192A, correction memory 193A and D/A converter 194A which construct the temperature compensating circuit 19 are all provided in the radio unit 1A, the radio unit 1A can be independently adjusted and, as a result, the adjusting operation after the PHS terminal has been assembled can be made unnecessary. By unifying the temperature sensor 191A, A/D converter 192A, correction memory 193A and D/A converter 194A as the temperature compensating circuit 19, the temperature compensating circuit can be integrated. Thus, the temperature compensating circuit and the PHS terminal can be further miniaturized and the cost thereof can be lowered.

Second Embodiment

In the second embodiment of this invention, only a temperature sensor for detecting the ambient temperature of a reference oscillator 17 is provided in a radio unit and a correction data storage section and frequency correction data storage section are provided in an internal memory of a control unit.

Figure 6:
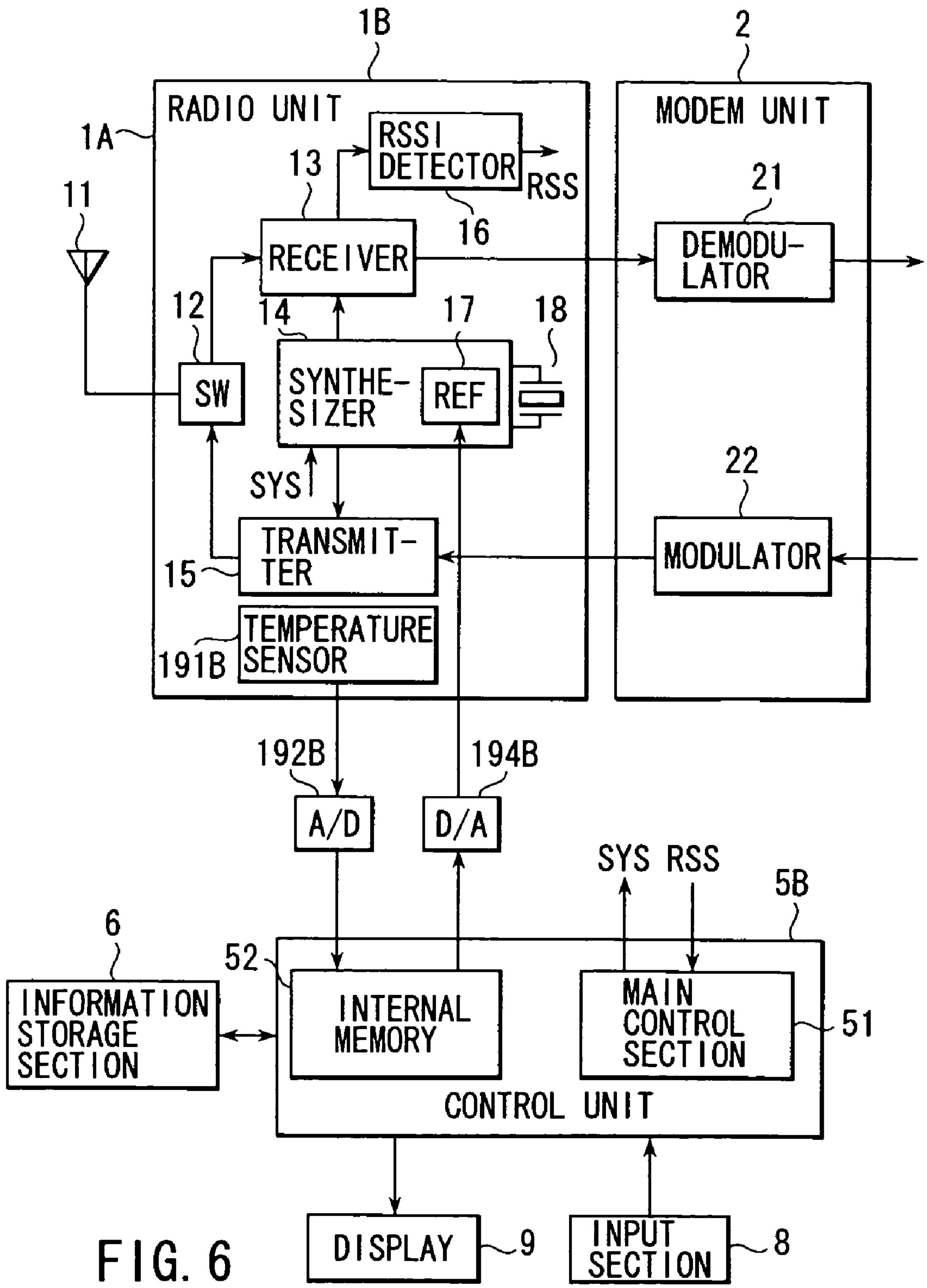
FIG. 6 is a block diagram showing the construction of the main portion of a PHS terminal according to a second embodiment of this invention.

FIG. 6 is a block diagram showing the construction of the main portion of a PHS terminal according to the second embodiment. In FIG. 6, portions which are the same as those of FIG. 1 are denoted by the same reference numerals and the explanation therefor is omitted.

A temperature sensor 191B is provided in a radio unit 1B. The temperature sensor 191B has a thermistor and detects the ambient temperature of the reference oscillator 17. An analog temperature detection signal output from the temperature sensor 191B is converted to a digital signal by an A/D converter 192B which is independently provided outside the radio unit 1B and then supplied to a control unit 5B.

In an internal memory 52 of the control unit 5B, a frequency correction data storage section and correction address storage section are provided. Like the correction memory 193A of FIG. 4, frequency correction data and correction addresses MA0 to MA70 corresponding to correct temperature values obtained by correcting measured temperature values are stored in the above storage sections. The frequency correction data and correction addresses MA0 to MA70 are stored in the initial setting process when the terminal is assembled.

The frequency correction data read out from the frequency correction data storage section of the internal memory 52 is converted to an analog control voltage by a D/A converter 194B which is independently provided outside the radio unit 1B and then supplied to the reference oscillator 17 in the radio unit 1B.

With the above construction, since the frequency correction data storage section and correction address storage section are provided in the internal memory 52 of the existing control unit 5B, it is not necessary to newly provide a memory 193A for temperature correction, simplify and reduce the size of the circuit construction for temperature compensation accordingly and lower the cost thereof.

Third Embodiment

The third embodiment of this invention is attained by providing a temperature sensor and an A/D converter for converting a temperature detection signal output from the temperature sensor to a digital value in a radio unit, providing a frequency correction data storage section and correction address storage section in an internal memory of an existing control unit and independently providing a D/A converter for converting frequency correction data read out from the internal memory to an analog signal outside the control unit and radio unit.

Figure 7:
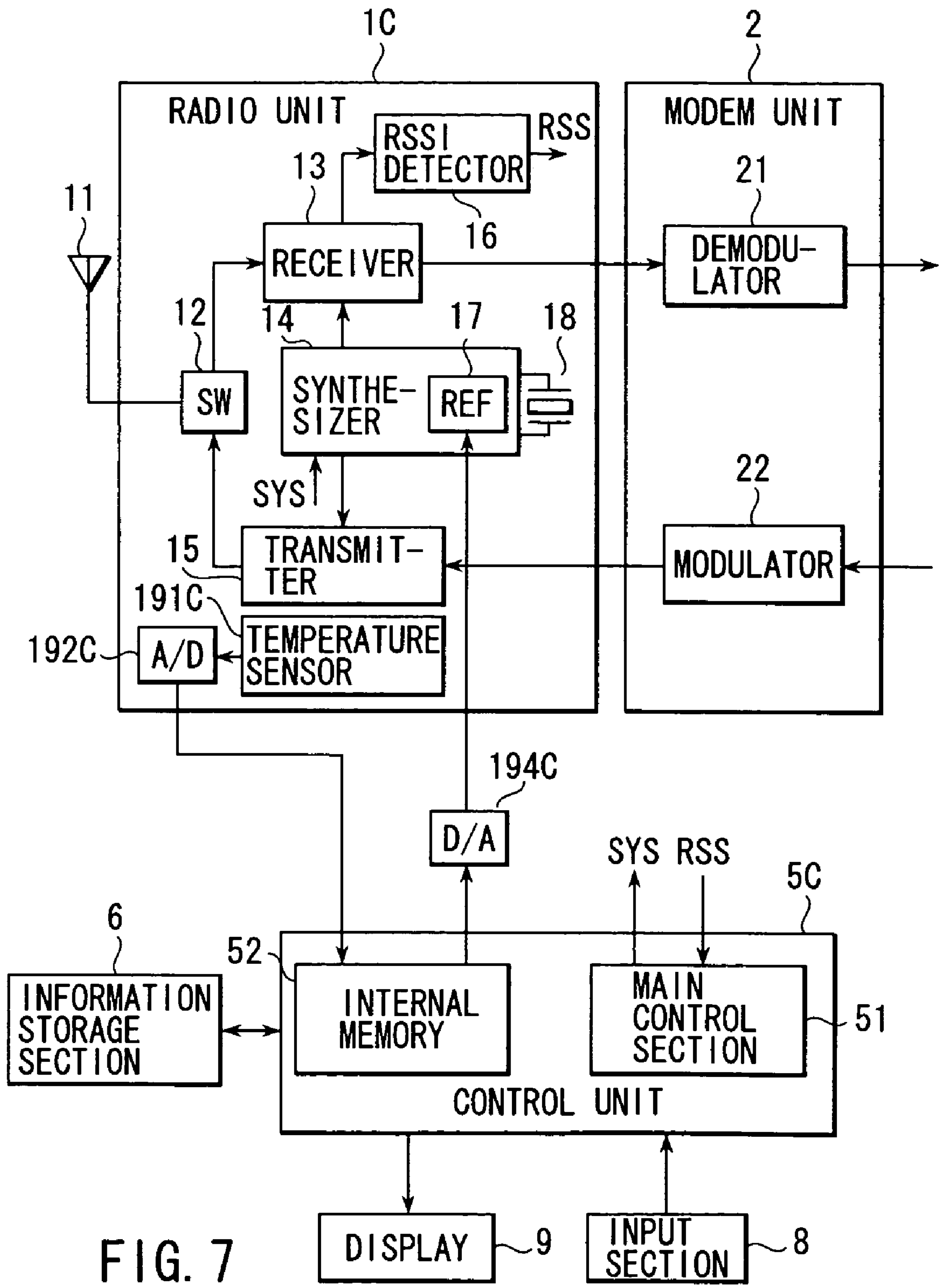
FIG. 7 is a block diagram showing the construction of the main portion of a PHS terminal according to a third embodiment of this invention.

FIG. 7 is a block diagram showing the construction of the main portion of a PHS terminal according to the third embodiment. In FIG. 7, portions which are the same as those of FIG. 1 are denoted by the same reference numerals and the explanation therefor is omitted.

A temperature sensor 191C and A/D converter 192C are provided in a radio unit 1C. The temperature sensor 191B has a thermistor and detects the ambient temperature of a reference oscillator 17. The A/D converter 192C converts an analog temperature detection signal output from the temperature sensor 191C to a digital signal which can be processed by a control unit 5C.

In an internal memory 52 of the control unit 5C, a frequency correction data storage section and correction address storage section are provided. Like the correction memory 193A of FIG. 4, frequency correction data and correction addresses MA0 to MA70 for correct temperature values obtained by correcting measured temperature values are stored in the above storage sections. The frequency correction data and correction addresses MA0 to MA70 are stored in the initial setting process when the terminal is assembled.

The frequency correction data read out from the frequency correction data storage section of the internal memory 52 is converted to an analog control voltage by a D/A converter 194C which is independently provided outside the radio unit 1C and then supplied to the reference oscillator 17 in the radio unit 1C.

With the above construction, like the second embodiment, since the frequency correction data storage section and correction address storage section are provided in the internal memory 52 of the existing control unit 5C, it is not necessary to newly provide a memory 193A for temperature correction, simplify and reduce the size of the circuit construction for temperature compensation accordingly and lower the cost thereof. Further, the temperature sensor 191C and A/D converter 192C can be integrated by accommodating the temperature sensor 191C and A/D converter 192C in the radio unit 1C.

Fourth Embodiment

In the fourth embodiment of this invention, a temperature only for one representative temperature in the entire temperature variation range which can be assumed to be used is actually measured when a temperature sensor having substantially a linear detection characteristic and then corrected temperatures for the respective temperatures in the entire temperature variation range are derived based on a difference between the measured temperature and an actual temperature (expected temperature) and stored in a correction address storage section.

The main portion of a temperature compensating circuit according to the fourth embodiment of this invention is explained below. The constructions of the PHS terminal and the temperature compensating circuit in the fourth embodiment are the same as those shown in FIGS. 1 and 2 except the temperature sensor and correction memory and therefore the temperature compensating circuit is explained with reference to FIGS. 1 and 2.

Figure 8:
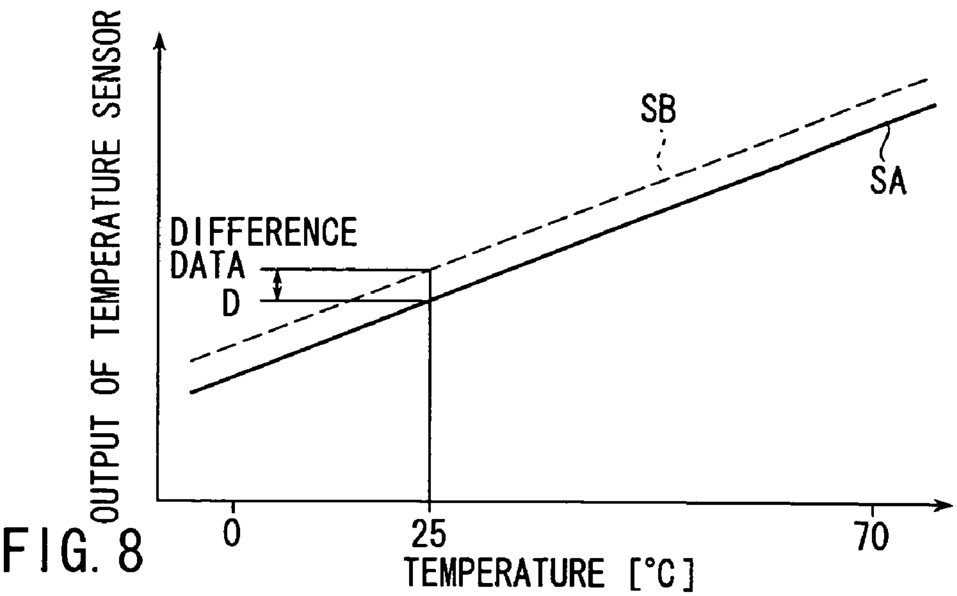
FIG. 8 is a diagram showing one example of the detection characteristic of a temperature sensor used in a temperature compensating circuit according to a fourth embodiment of this invention.

FIG. 8 shows one example of the detection characteristic of the temperature sensor used in the temperature compensating circuit according to the fourth embodiment and the detection characteristic SA is substantially linear as shown in FIG. 8.

Figure 9:
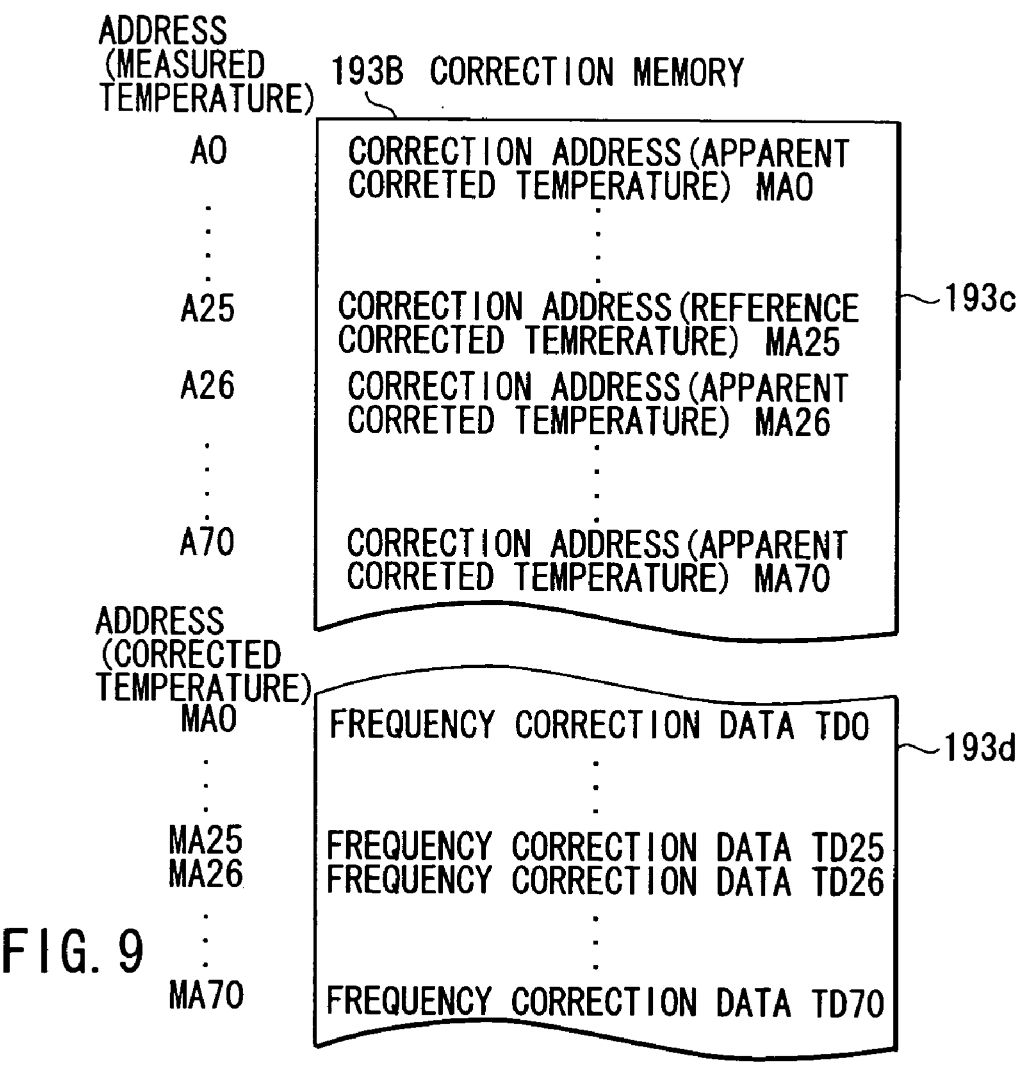
FIG. 9 is a diagram showing the construction of a correction memory provided in the temperature compensating circuit according to the fourth embodiment of this invention.

FIG. 9 shows the construction of a correction memory 193B used in the fourth embodiment and including a correction address storage section 193*c* and frequency correction data storage section 193*d*.

First, frequency correction data items for correcting the oscillation frequencies of a reference oscillator 17 to correct frequencies for the respective temperature values which are set at 1° C. intervals in an ambient temperature variation range (for example, 0° C. to 70° C.) which is assumed to be used are stored in the frequency correction data storage section 193*d*. Correct ambient temperatures or corrected temperatures obtained by correcting measured temperatures in an entire measured temperature range of the temperature sensor 191B for the respective measured temperatures are stored in the correction address storage section 193*c*.

The corrected temperatures are set in the correction address storage section 193*c* as follows. That is, a desired temperature in the entire temperature variation range (0° C. to 70° C.) which is assumed to be used, for example, 25° C. is selected as the representative temperature and a temperature only for the representative temperature is actually measured by use of the temperature sensor 191B. A difference between the measured temperature and the actual ambient temperature (expected temperature) is derived and then corrected temperatures which can be regarded as being correct are derived by uniformly adding or subtracting the above difference to or from all of the other temperatures in the temperature variation range. SB in FIG. 8 shows one example of the apparent corrected temperature detection characteristic.

The apparent corrected temperatures are stored as correction addresses MA0 to MA70 for accessing the frequency correction data storage section 193 in the correction address storage section 193*c* in correspondence to the respective measured temperatures A0 to A70.

By using the above setting method, it becomes unnecessary for the assembling operator to actually measure detection temperatures while changing the ambient temperature at 1° C. intervals in the entire temperature range (0° C. to 70° C.) and it is only required to actually measure a temperature only for the representative temperature of 25° C. by use of the temperature sensor 191B. Therefore, it becomes possible to easily set the correction addresses MA0 to MA70 in a short period of time.

In the fourth embodiment, apparent corrected temperatures derived based on the difference between the measured temperature for the representative temperature and the actual temperature (expected temperature) are set for the temperatures other than the representative temperature 25° C. Therefore, in comparison with the first embodiment in which the corrected temperatures are derived by actually measuring the detected temperature values of the temperature sensor over the entire temperature range, the precision of the corrected temperature values will be definitely lowered. However, since an element having substantially the linear detection characteristic is used as the temperature sensor, it is possible to set the correction addresses without causing any problem in practice.

Fifth Embodiment

In the fifth embodiment of this invention, a temperature only for one representative temperature in the entire temperature variation range which is assumed to be used is actually measured when a temperature sensor having substantially a linear detection characteristic is used, then a difference between the actually measured value of the representative temperature and an expected value thereof is derived and difference data corresponding to the difference is stored in a difference data storage section. When the terminal is used, a corrected temperature is derived based on the measured temperature of the temperature sensor and the difference data, the thus derived corrected temperature is used as a correction address to access a frequency correction data storage section so as to read out corresponding frequency correction data and then the oscillation frequency of the reference oscillator is corrected based on the frequency correction data.

Figure 10:
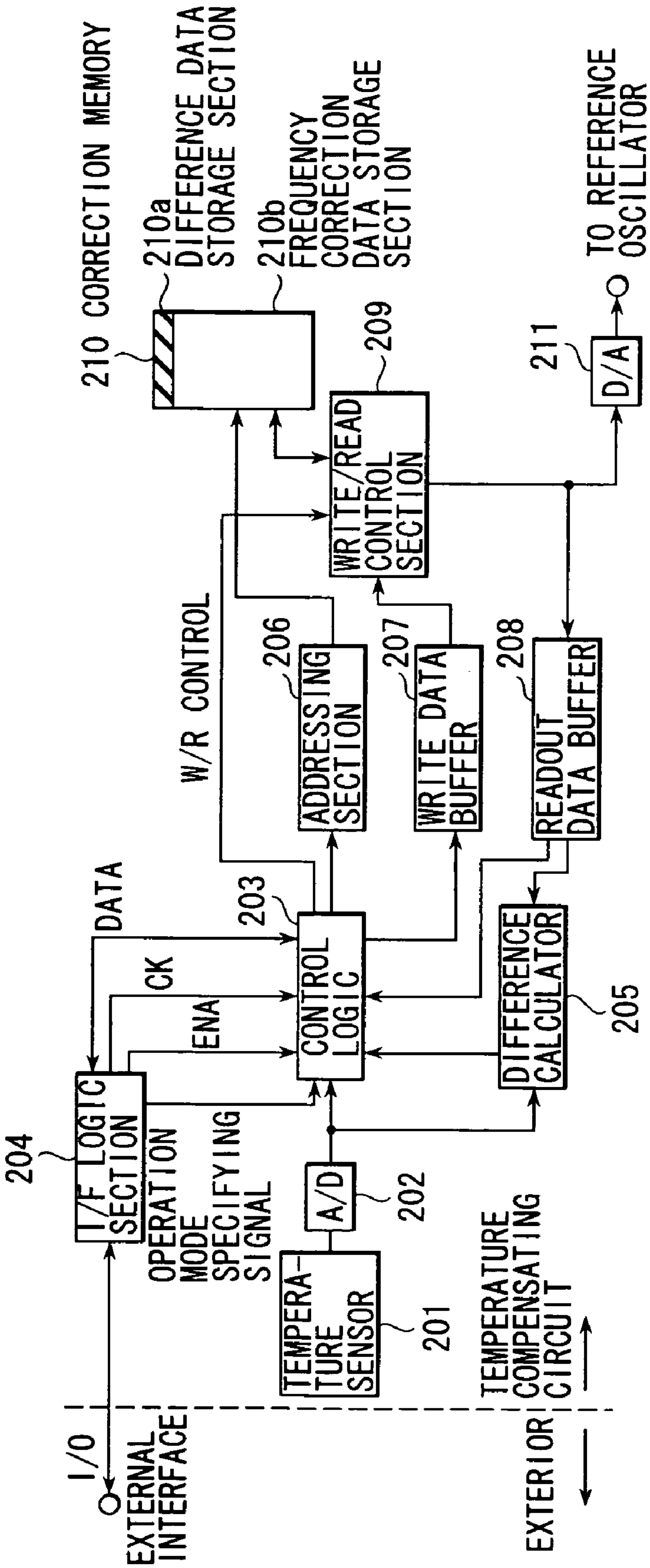
FIG. 10 is a block diagram showing the construction of a temperature compensating circuit according to a fifth embodiment of this invention.

FIG. 10 is a block diagram showing the construction of the temperature compensating circuit according to the fifth embodiment. Since the construction of the PHS terminal provided in the temperature compensating circuit is the same as that shown in FIG. 1, the explanation therefor is omitted here.

A correction memory 210 is provided in the temperature compensating circuit. The correction memory 210 includes a difference data storage section 210*a* and frequency correction data storage section 210*b*. Frequency correction data items for correcting the oscillation frequencies of a reference oscillator 17 to correct frequencies for respective temperature values which are set at 1° C. intervals in an ambient temperature variation range (for example, 0° C. to 70° C.) which is assumed to be used are stored in the frequency correction data storage section 210*b*. Difference data between a temperature value actually measured for one representative temperature in the temperature variation range (0° C. to 70° C.) and the expected temperature value is stored in the difference data storage section 210*a*.

The difference data is set in the difference data storage section 210*a* of the correction memory 210 as follows. That is, in the terminal assembling process, an external setting device such as a personal computer is connected to an interface (I/F) logic 204 of the temperature compensating circuit. In this state, the ambient temperature is set to 25° C. which is the representative temperature and the temperature compensating circuit is caused to effect the initializing operation.

After this, the detected temperature of the temperature sensor 210 is converted to a digital value in an A/D converter 202, then input to a control logic 203 and output from the control logic 203 to the external setting device via the I/F logic 204. The external setting device fetches the measured temperature, compares the measured temperature with the present ambient temperature 25° C. which is the expected value to derive difference data therebetween. If the measured temperature is 27C, for example, the difference data is 2C.

Then, the external setting device inputs the difference data 2° C. to the control logic 203 via the I/F logic 204. The control logic 203 controls an addressing section 206 to generate an address which specifies the difference data storage section 210*a* and causes a write data buffer 207 to hold the difference data. Next, it supplies a write control signal (W control signal) to a write/read control section 209. Then, difference data is read out from the write data buffer 207 by the write/read control section 209 and the difference data is written into the difference data storage section 210*a* whose address is specified by the addressing section 206.

Figure 11:
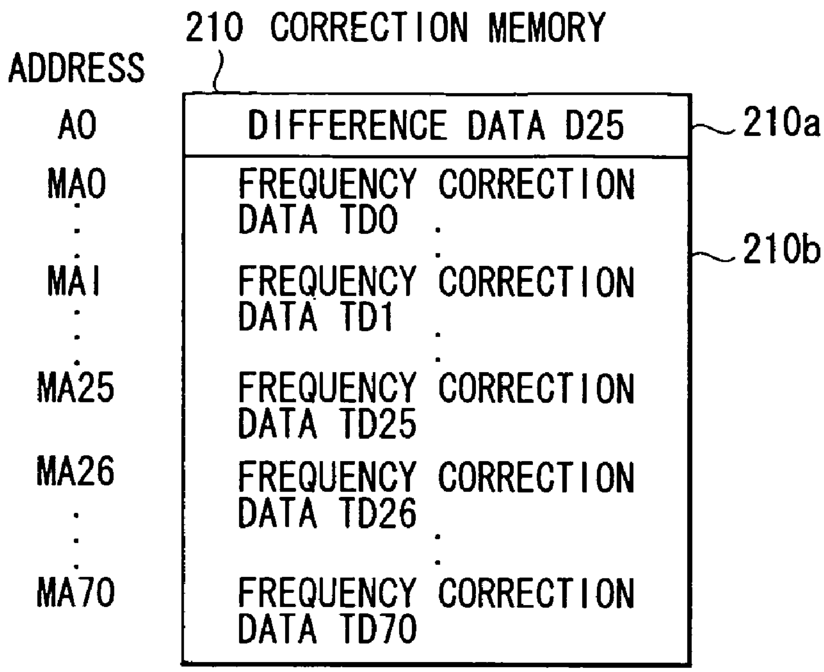
FIG. 11 is a diagram showing the construction of a correction memory of the temperature compensating circuit shown in FIG. 10.

Thus, the difference temperature data of 2° C. for the representative temperature 25° C. can be set. FIG. 11 shows the construction of the correction memory 210 indicating the setting state. Further, the process for setting frequency correction data into the frequency correction data storage section 210*b* is effected by deriving correction data items TD0 to TD70 of the oscillation frequency at 1° C. intervals in the assumed temperature variation range (for example, 0° C. to 70° C.) based on the rated value of the oscillation characteristic of the quartz oscillator 18 in the external setting device and writing the frequency correction data TD0 to TD70 into the frequency correction data storage section 210*b* as shown in FIG. 11.

Assume now that the PHS terminal is used under a certain environmental condition. Then, the ambient temperature of the reference oscillator 17 is detected by the temperature sensor 201 of the temperature compensating circuit 19 and the measured temperature value is converted into a digital value by the A/D converter 202 and then supplied to a difference calculating section 205.

The control logic 203 controls the addressing section 206 to generate an address which specifies the difference data storage section 210*a* and supplies a read control signal (R control signal) to the write/read control section 209. Then, difference data 2° C. is read out from the difference data storage section 210*a* by the write/read control section 209 and held in a readout data buffer 208.

The difference calculating section 205 subtracts the difference data held in the readout data buffer 208 from the measured temperature of the temperature sensor 201 and supplies the temperature obtained as the result of subtraction to the control logic 203 as the corrected temperature. For example, assuming that the ambient temperature measured by the temperature sensor 201 is 40° C., a temperature value obtained by subtracting the difference data 2° C. from the measured temperature 40° C., that is, 38° C. is supplied to the control logic 203 as the corrected temperature.

The control logic 203 supplies the corrected temperature 38° C. as a correction address to the correction memory 210 via the addressing section 206 and supplies a read control signal (R control signal) to the write/read control section 209. Then, frequency correction data corresponding to the corrected temperature 38° C. is read out from an addressed area of the frequency correction data storage section 210*b* by the write/read control section 209. After this, the frequency correction data is converted to an analog control voltage by the D/A converter 211 and supplied to the reference oscillator 17.

In the reference oscillator 17, the capacitance of the variable capacitance element 172 is changed according to the value of the analog control voltage and, as a result, a temperature-compensated reference oscillation frequency is output from the transistor oscillation circuit 173.

After this, each time the measured temperature of the temperature sensor 210 is changed by 1° C. or more, the operations for correcting the measured temperature based on the difference data, reading out frequency correction data by using the corrected temperature as a correction address and supplying the control signal to the reference oscillator 17 are repeatedly effected.

As described above, in the fifth embodiment, the difference data between the temperature value of the temperature sensor 201 measured for the representative temperature 25° C. and the expected temperature value is stored in the difference data storage section 210*a*. Then, each time the measured temperature value detected by the temperature sensor 210 is changed, a corrected temperature is derived based on the measured temperature and the difference data by the difference calculating section 205, and the corrected temperature is supplied as a correction address to the frequency correction data storage section 210*b* to read out corresponding frequency correction data. Then, the frequency correction data is converted to an analog control signal which is in turn supplied to the reference oscillator 17 and, as a result, the reference oscillation frequency is compensated for according to the temperature.

Therefore, according to the fifth embodiment, the measured temperatures in the entire temperature range (0° C. to 70° C.) are uniformly corrected based on the difference data which is previously set at the representative temperature 25° C. and the reference oscillation frequency is corrected based on the corrected temperature. Thus, the detection error of the temperature sensor 210 is corrected in the entire temperature range (0° C. to 70° C.) and the reference oscillation frequency can be corrected, thereby making it possible to provide a stable reference oscillation frequency.

Further, in the fifth embodiment, only the difference data between the measured temperature derived at the representative temperature 25° C. and the expected temperature is stored in the difference data storage section 210*a*. Therefore, in comparison with the first to fourth embodiments, the storage capacity of the correction memory 210 can be significantly reduced and the circuit scale of the temperature compensating circuit can be reduced. This effect is extremely important in the PHS terminal in which a reduction in the size and weight thereof is dealt with as one of the most important subjects.

Sixth Embodiment

In the sixth embodiment of this invention, in a case where a temperature sensor having a nonlinear detection characteristic is used, an entire temperature variation range which can be assumed to be used is divided into three regions, that is, low-temperature region, intermediate-temperature region and high-temperature region, one representative temperature is selected for each divided temperature region, temperatures are actually measured for the respective representative temperatures and correction addresses are derived for temperatures in the respective divided temperature regions based on differences between the measured temperatures and actual temperatures (expected temperatures) thereof and stored in a correction address storage section.

The main portion of a temperature compensating circuit according to the sixth embodiment of this invention is explained below. The constructions of the PHS terminal and the temperature compensating circuit in the sixth embodiment are the same as those shown in FIGS. 1 and 2 except the correction memory and therefore the temperature compensating circuit is explained with reference to FIGS. 1 and 2.

Figure 12:
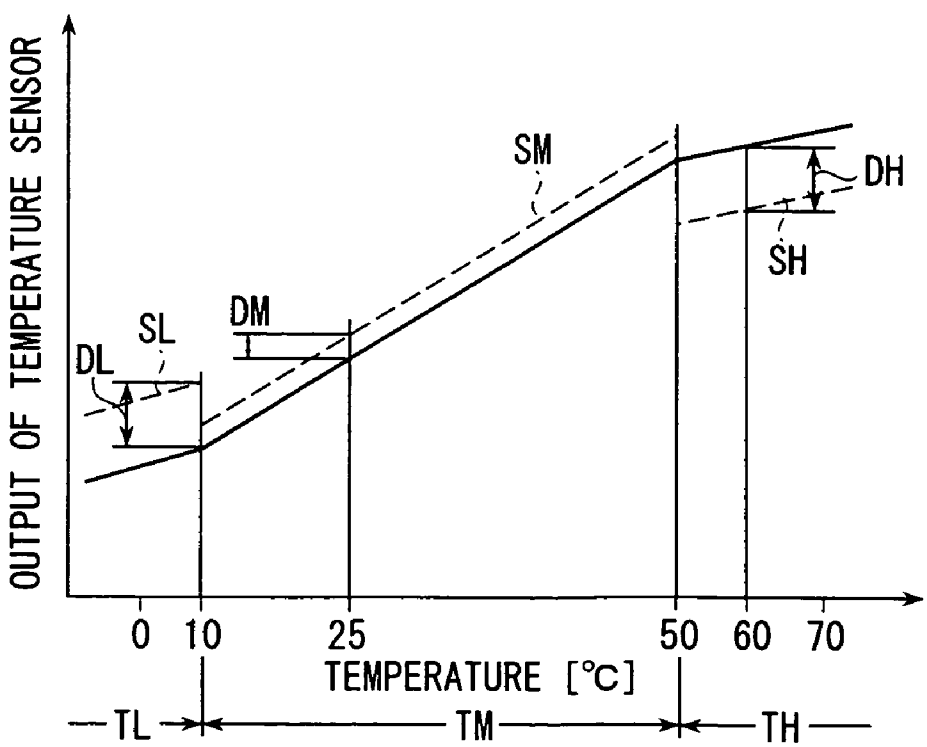
FIG. 12 is a diagram showing one example of the detection characteristic of a temperature sensor used in a temperature compensating circuit according to a sixth embodiment of this invention.

FIG. 12 equivalently shows one example of the detection characteristic of a temperature sensor used in the temperature compensating circuit according to the sixth embodiment and the detection characteristic is substantially nonlinear as shown in FIG. 12.

Figure 13:
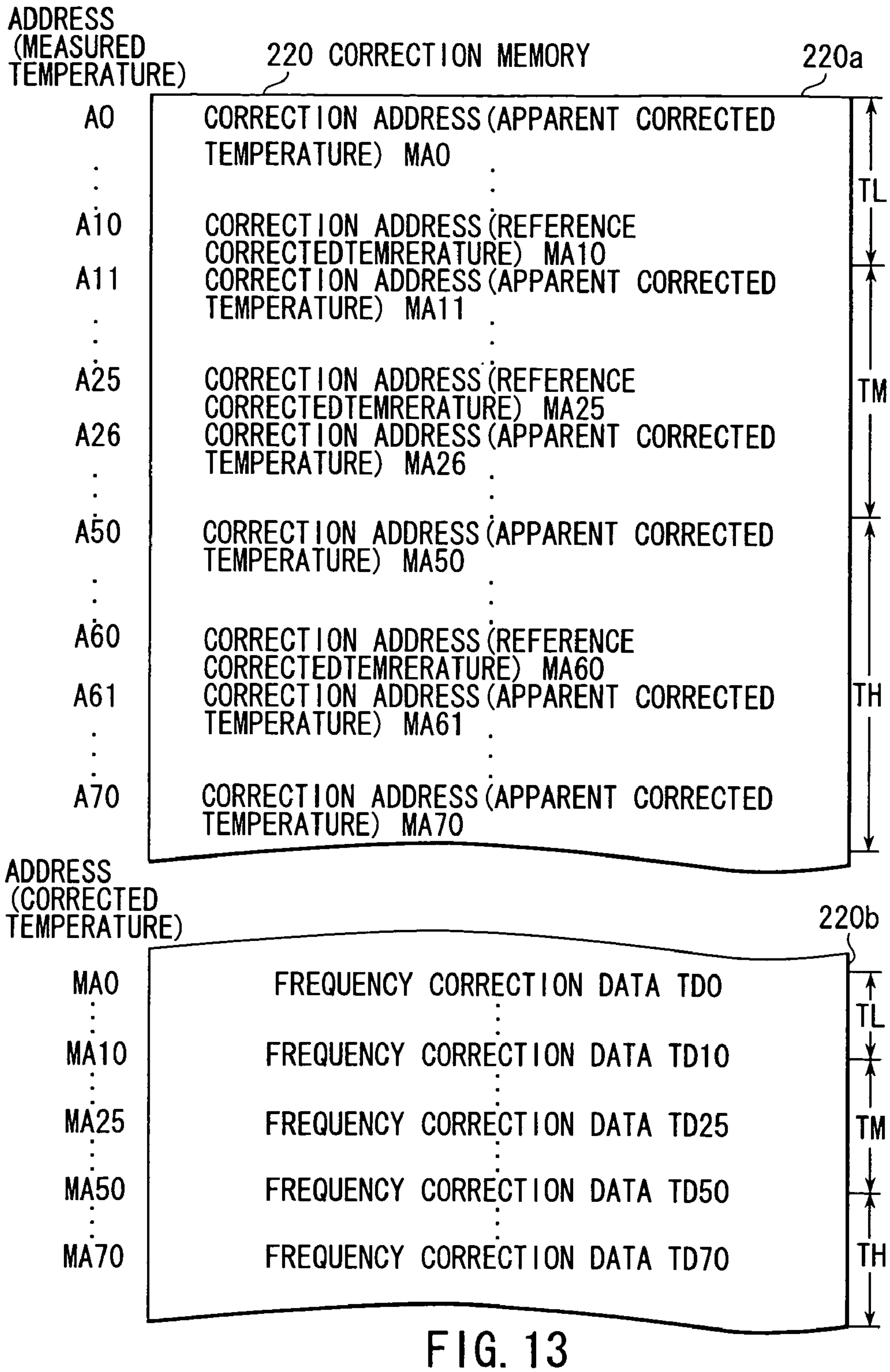
FIG. 13 is a diagram showing the construction of a correction memory provided in the temperature compensating circuit according to the sixth embodiment of this invention.

FIG. 13 shows the construction of a correction memory 220 used in the temperature compensating circuit according to the sixth embodiment and including a correction address storage section 220*a* and frequency correction data storage section 220*b*.

First, frequency correction data items for correcting the oscillation frequencies of a reference oscillator 17 to correct frequencies for the respective temperature values which are set at 1° C. intervals in an ambient temperature variation range (for example, 0° C. to 70° C.) which is assumed to be used are stored in the frequency correction data storage section 220*b*. Correct ambient temperatures or corrected temperatures obtained by correcting measured temperatures in an entire measured temperature range by the temperature sensor are stored in correspondence to the respective measured temperatures in the correction address storage section 220*a*.

The corrected temperatures are set in the correction address storage section 220*a* as follows. That is, as shown in FIG. 12, the entire temperature variation range (0° C. to 70° C.) which is assumed to be used is divided into three regions of low-temperature region TL, intermediate-temperature region TM and high-temperature region TH. Representative temperatures, for example, 10° C., 25° C., 60° C. are selected for the respective divided temperature regions TL, TM, TH and temperatures are actually measured for the respective representative temperatures 10° C., 25° C., 60° C. by use of the temperature sensor.

Then, difference data items DL, DM, DH between the measured temperatures and actual ambient temperatures (expected temperatures) are derived and corrected temperatures which are regarded as being correct are derived by uniformly adding or subtracting the difference data items DL, DM, DH to or from all of the other temperatures in the respective divided temperature regions TL, TM, TH. SL, SM, SH in FIG. 12 respectively show examples of the apparently corrected detection characteristics.

Addresses of the frequency correction data storage section 220*b* in which frequency correction data items for the apparent corrected temperatures are stored are set as correction addresses MA0 to MA10, MA11 to MA49, MA50 to MA70. The correction addresses MA0 to MA10, MA11 to MA49, MA50 to MA70 are stored in the correction address storage section 220*a* in correspondence to measured temperatures A0 to A10, A11 to A49, A50 to A70 as shown in FIG. 13.

By using the above setting method, it becomes unnecessary for the assembling operator to actually measure detection temperatures while changing the ambient temperature at 1° C. intervals in the entire temperature range (0° C. to 70° C.) and it is only required to actually measure temperatures only for the representative temperatures of 10° C., 25° C., 60° C. by use of the temperature sensor. Therefore, it becomes possible to easily set the correction addresses MA0 to MA10, MA11 to MA49, MA50 to MA70 in a short period of time.

Further, the entire temperature variation range which is assumed to be used is divided into three regions of low-temperature region TL, intermediate-temperature region TM and high-temperature region TH, difference data items DL, DM, DH between the representative temperatures 10° C., 25° C., 60° C. and the expected temperatures thereof are derived for the respective divided temperature regions TL, TM, TH, and the correction addresses at the respective temperatures are set for the respective divided temperature regions TL, TM, TH based on the difference data items DL, DM, DH. Therefore, even when the temperature sensor having a nonlinear detection characteristic is used, the detection error thereof can be effectively corrected.

Seventh Embodiment

In the seventh embodiment of this invention, in a case where a temperature sensor having a nonlinear detection characteristic is used, an entire temperature variation range which can be assumed to be used is divided into three regions of low-temperature region, intermediate-temperature region and high-temperature region, and difference data between an actually measured value of one representative temperature which is selected for each divided temperature region and an expected temperature value thereof is derived and stored in a difference data storage section. Then, when the terminal is used, a corrected temperature is derived based on the measured temperature of the temperature sensor and difference data of a corresponding one of the divided temperature regions, the derived corrected temperature is used as a correction address to access the frequency correction data storage section and read out corresponding frequency correction data and the oscillation frequency of a reference oscillator is compensated for according to the temperature based on the frequency correction data.

Figure 14:
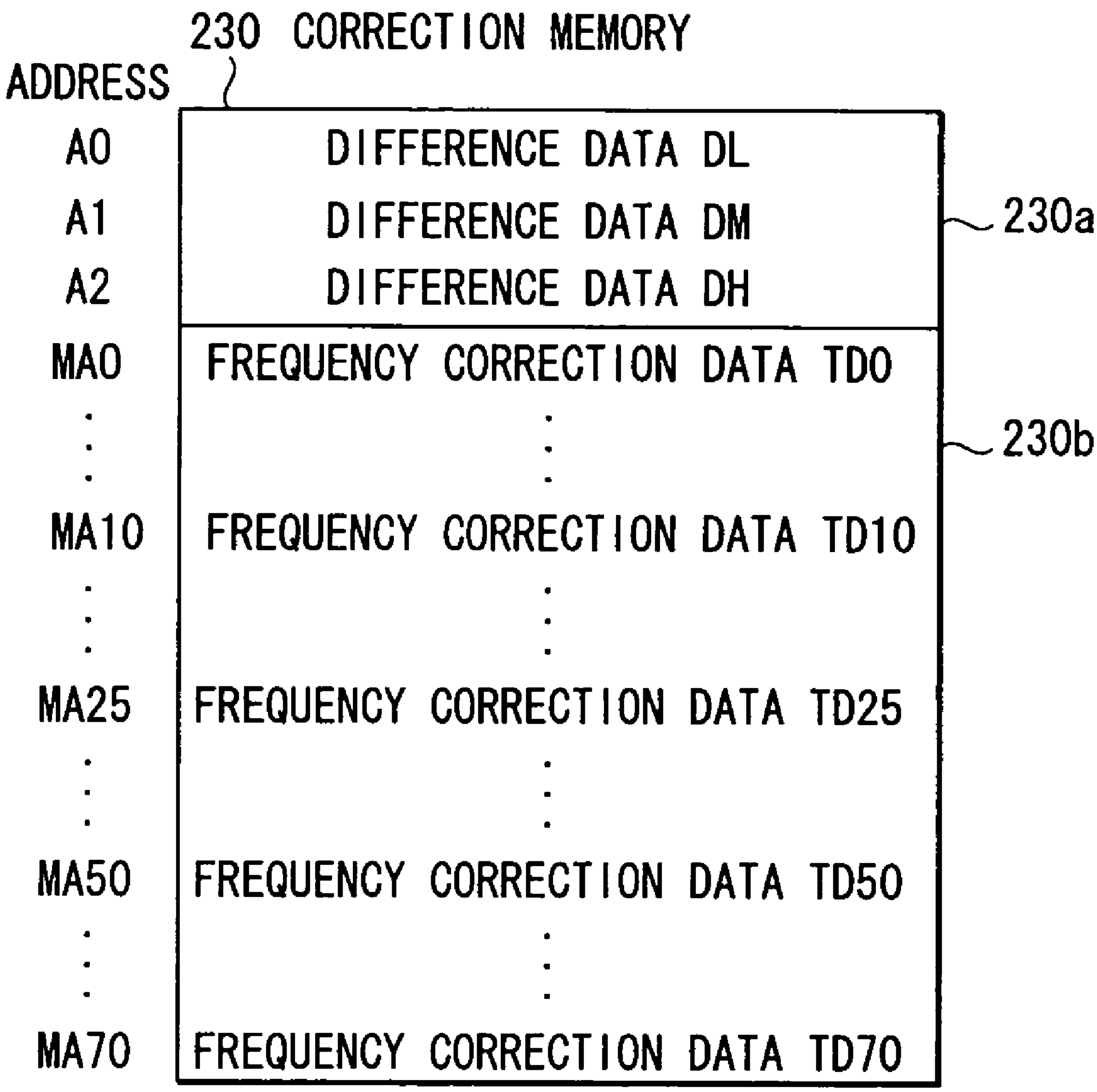
FIG. 14 is a diagram showing the construction of a correction memory provided in a temperature compensating circuit according to a seventh embodiment of this invention.

FIG. 14 shows the construction of a correction memory 230 used in the temperature compensating circuit according to the seventh embodiment. The construction of the temperature compensating circuit in which the correction memory is provided is the same as that shown in FIG. 10 and the explanation therefor is omitted here.

The correction memory 230 includes a difference data storage section 230*a* and frequency correction data storage section 230*b*. Frequency correction data items for correcting the oscillation frequencies of a reference oscillator 17 to correct frequencies are stored in the frequency correction data storage section 230*b* in correspondence to temperature values which are set at 1° C. intervals in an ambient temperature variation range (for example, 0° C. to 70° C.) which is assumed to be used. Difference data items DL, DM, DH between actually measured temperature values derived for the respective representative temperatures in the three divided temperature regions TL, TM, TH and expected temperature values thereof are stored in the difference data storage section 230*a*.

The operation for setting difference data into the difference data storage section 230*a* is effected by use of the temperature compensating circuit shown in FIG. 10 as follows.

That is, in the terminal assembling process, a setting device such as a personal computer is connected to the interface (I/F) logic 204 of the temperature compensating circuit. In this state, the ambient temperature is set to the representative temperature 10° C. of the low-temperature region TL among the three divided temperature regions TL, TM, TH and the temperature compensating circuit is caused to effect the initializing operation.

Then, the detected temperature of the temperature sensor 201 is input to the control logic 203 after it is converted to the digital value by an A/D converter 202 and the digital value is output from the control logic 203 to the external setting device via the I/F logic 204. The external setting device fetches the measured temperature and compares the measured temperature with the present ambient temperature 10° C. which is an expected temperature value to derive difference data DL therebetween.

The external setting device supplies the difference data DL to the control logic 203 via the I/F logic 204. Then, the control logic 203 controls the addressing section 206 to generate an address A0 for specifying a first area of the difference data storage section 210*a* and causes the write data buffer 207 to hold the difference data DL. Further, it supplies a write control signal (W control signal) to the write/read control section 209. Then, the difference data DL is read out from the write data buffer 207 by the write/read control section 209 and written into the address area A0 of the differential data storage section 210*a* specified by the addressing section 206.

Like the case of the representative temperature 10° C., actually measured temperatures and difference data items DM, DH are sequentially derived for the representative temperature 25° C., 60° C. of the intermediate-temperature region TM and high-temperature region TH and written into corresponding address areas A1, A2 of the difference data storage section 230*a*.

The operation for setting frequency correction data into the frequency correction data storage section 230*b* is effected as follows. Correction data items TD0 to TD70 of oscillation frequencies which are set at 1° C. intervals in the assumed temperature variation range (for example, 0 to 70° C.) are derived based on the rated value of the oscillation characteristic of a quartz oscillator 18 in the external setting device. Then, the frequency correction data items TD0 to TD70 are written into the frequency correction data storage section 230*b* as shown in FIG. 14.

Assume now that the PHS terminal is used under a certain environmental condition. Then, the ambient temperature of the reference oscillator 17 at this time is detected by the temperature sensor and the measured temperature is converted into a digital value by the A/D converter 202 and then supplied to the difference calculating section 205.

The control logic 203 determines one of the three divided temperature regions TL, TM, TH in which the measured temperature detected by the temperature sensor is contained. Then, it causes the addressing section 206 to generate an address corresponding to the divided temperature region thus determined and supply the same to the difference data storage section 230*a*. At the same time, the control logic supplies a read control signal (R control signal) to the write/read control section 209. As a result, difference data is read out from the specified address location of the difference data storage section 230*a* by the write/read control section 209 and held in the readout data buffer 208.

For example, assume now that the measured temperature detected by the temperature sensor is 40° C. Since the measured temperature 40° C. is contained in the divided temperature region TM, the address A1 corresponding to the divided temperature region TM is generated from the addressing section 206 and supplied to the difference data storage section 230*a*. Therefore, difference data DM stored in the address A1 is read out from the difference data storage section 230*a* and held in the readout data buffer 208.

The difference calculating section 205 subtracts the difference data DM held in the readout data buffer 208 from the measured temperature of the temperature sensor 201 and supplies the temperature value obtained as the result of subtraction to the control logic 203 as the corrected temperature. For example, assume that the difference data DM is 1° C. and the ambient temperature measured by the temperature sensor 201 is 40° C. as described before. Then, a temperature value obtained by subtracting the difference data 1° C. from the measured temperature 40° C., that is, 39° C. is supplied to the control logic 203 as the corrected temperature.

The control logic 203 supplies the corrected temperature 39° C. as a correction address to the correction memory 210 via the addressing section 206 and supplies a read control signal (R control signal) to the write/read control section 209. Then, frequency correction data corresponding to the corrected temperature 39° C. is read out from an addressed area of the frequency correction data storage section 210*b* by the write/read control section 209. After this, the frequency correction data is converted to an analog control voltage by the D/A converter 211 and supplied to the reference oscillator 17.

In the reference oscillator 17, the capacitance of the variable capacitance element 172 is changed according to the value of the analog control voltage and, as a result, a temperature-compensated reference oscillation frequency is output from the transistor oscillation circuit 173.

After this, each time the measured temperature of the temperature sensor 210 is changed by 1° C. or more, for example, the operations for correcting the measured temperature based on the difference data DL, DM, DH, reading out frequency correction data by using the corrected temperature as a correction address and supplying the control signal to the reference oscillator 17 are repeatedly effected.

As described above, in the seventh embodiment, temperatures are respectively measured at the representative temperature 10° C., 25° C., 60° C. for the three divided temperature regions TL, TM, TH, difference data items DL, DM, DH between the measured temperatures and the expected temperatures thereof are derived and stored in the difference data storage section 230*a*. Then, each time the measured temperature value detected by the temperature sensor is changed by a preset amount, a corrected temperature is derived based on the measured temperature and the difference data in the divided temperature region in which the measured temperature is contained by use of the difference calculating section 205, and the corrected temperature is supplied as a correction address to the frequency correction data storage section 230*b* to read out corresponding frequency correction data. Then, the readout frequency correction data is converted to an analog control signal which is in turn supplied to the reference oscillator 17 and, as a result, the reference oscillation frequency is compensated for according to the temperature.

Therefore, even if a temperature sensor having a nonlinear detection characteristic is used, a measured temperature is uniformly corrected for each of the three divided temperature regions TL, TM, TH and the reference oscillation frequency is corrected based on the corrected temperature. Thus, the detection error of the temperature sensor having the nonlinear detection characteristic can be effectively corrected.

Further, it becomes unnecessary for the assembling operator to actually measure detection temperatures while changing the ambient temperature at 1° C. intervals in the entire temperature range and it is only required to actually measure temperatures only for the representative temperatures 10° C., 25° C., 60° C. by use of the temperature sensor. Therefore, it becomes possible to easily set the correction addresses MA0 to MA10, MA11 to MA49, MA50 to MA70 in a short period of time.

Further, since only difference data items between measured temperatures derived for the representative temperatures 10° C., 25° C., 60° C. and the expected temperatures thereof are stored in the difference data storage section 230*a*, the storage capacity of the correction memory 230 can be significantly reduced in comparison with a case wherein corrected temperatures (correction addresses) in the entire temperature range are stored and the temperature compensating circuit can be made small.

This invention is not limited to the above embodiments. For example, in the first embodiment, a case wherein the correction address storage section and frequency correction data storage section are separately provided and the operation for correcting the measured temperature and reading out frequency correction data by use of the above storage sections is effected is explained. However, this invention is not limited to the above case and it is possible to previously form frequency correction data on which a correction amount of the detection error of the temperature sensor is reflected, store the same in the correction memory and access the correction memory by use of a measured temperature obtained by the temperature sensor so as to read out corresponding frequency correction data. With the above construction, the number of correction memories can be reduced to one, the storage capacity can be reduced by half and the memory is required to be accessed only once.

Further, the operation for correcting the measured temperature value obtained by the temperature sensor may be effected by causing the main control section 51 of the control unit 5B to perform the processing operation based on detection error characteristic data of the temperature sensor without using the memory table.

Further, in each of thee above embodiments, a case wherein the oscillation frequency of the reference oscillator 17 provided in the frequency synthesizer 14 of the PHS terminal is stabilized with respect to the ambient temperature is explained as an example, but this invention can be applied to another electronic circuit having a temperature characteristic, for example, a modulation/demodulation circuit or transmission amplification circuit. Further, this invention is not limited to the PHS terminal and can be applied to another mobile communication terminal such as a portable telephone, a base station of a mobile communication system, an automatic meter reading terminal device or audio device. That is, this invention can be applied to any type of electronic circuit having a temperature characteristic and an electronic device including the electronic circuit.

Further, modifications for selectively combining parts or the entire portions of the constructions of the first to seventh embodiments to form another configuration, or omitting parts of the first to seventh embodiments can be freely made without departing from the technical scope of this invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A temperature compensating circuit for compensating an operation of an electronic circuit having a temperature characteristic in accordance with an ambient temperature of the electronic circuit, comprising:

temperature detecting means for detecting an ambient temperature of the electronic circuit; and temperature compensating control means comprising:

first storage means for storing corrected temperatures each of which corresponds to one of a plurality of detected ambient temperatures, the detected ambient temperatures being within a temperature range that is to be corrected and that is a detection characteristic of the temperature detecting means, and said corrected temperatures being set at values for correcting detection errors in the detected ambient temperatures;

second storage means for storing operation correction data prepared for correcting a temperature characteristic of the electronic circuit; and correction processing means for selectively reading, from the first storage means, one of the corrected temperatures corresponding to the ambient temperature detected by the temperature detecting means, and for correcting the operation of the electronic circuit on the basis of the corrected temperature and operation correction data stored in the second storing means corresponding to the corrected temperature.

2. The temperature compensating circuit according to claim 1, wherein said electronic circuit is an oscillator circuit for generating a reference oscillation frequency.

3. A temperature compensating circuit for compensating an operation of an electronic circuit having a temperature characteristic in accordance with an ambient temperature of the electric circuit, comprising:

temperature detecting means for detecting an ambient temperature of the electronic circuit; and temperature compensating control means comprising:

first storage means for storing corrected temperatures each of which corresponds to one of a plurality of detected ambient temperatures, said corrected temperatures being set at values for correcting detection errors in the detected ambient temperatures on the basis of a difference between a measure temperature measured with respect to a representative temperature and an expectation temperature expected with respect to the representative temperature, said representative temperature being a temperature within a temperature range that is to be corrected and that is a detection characteristic of said temperature detecting means;

second storage means for storing an operation correction data prepared for correcting a temperature characteristic of the electronic circuit; and correction processing means for selectively reading, from the first storage means, a corrected temperature corresponding to the ambient temperature detected by the temperature detecting means, and for correcting the operation of the electronic circuit on the basis of the corrected temperature and operation correction data stored in the second storing means corresponding to the corrected temperature.

4. The temperature compensating circuit according to claim 3, wherein said electronic circuit is an oscillator circuit for generating a reference oscillation frequency.

5. An electronic apparatus comprising:

an electronic circuit having a temperature characteristic and designed for performing a predetermined operation;

a temperature-detecting means for detecting an ambient temperature of the electronic circuit during operation; and a temperature compensation circuit comprising:

first storage means for storing corrected temperatures each of which corresponds to one of a plurality of detected ambient temperatures, the detected ambient temperatures being within a temperature range that is to be corrected and that is a detection characteristic of the temperature detecting means, and said corrected temperatures being set at values for correcting detection errors in the detected ambient temperatures;

second storage means for storing an operation correction data prepared for correcting a temperature characteristic of the electronic circuit; and correction processing means for selectively reading, from the first storage means, a corrected temperature corresponding to the ambient temperature of the electronic circuit detected by the temperature detecting means during operation, and for correcting the operation of the electronic circuit on the basis of the corrected temperature and operation correction data stored in the second storing means corresponding to the corrected temperature.

6. The electronic circuit according to claim 5, wherein said electronic circuit is an oscillator circuit for generating a reference oscillation frequency.

7. An electronic apparatus comprising:

an electronic circuit having a temperature characteristic and designed for performing a predetermined operation;

a temperature-detecting means for detecting a current ambient temperature of the electronic circuit; and a temperature compensation circuit comprising:

first storage means for storing corrected temperatures each of which corresponds to one of a plurality of detected ambient temperatures, said corrected temperatures being set at values for correcting detection errors in the detected ambient temperatures on the basis of a difference between a measure temperature measured with respect to a representative temperature and an expectation temperature expected with respect to the representative temperature, said representative temperature being a temperature within a temperature range that is to be corrected and that is a detection characteristic of said temperature detecting means;

second storage means for storing operation correction data prepared for correcting a temperature characteristic of the electronic circuit; and correction processing means for selectively reading, from the first storage means, a corrected temperature corresponding to the current ambient temperature detected by the temperature detecting means, and for correcting the operation of the electronic circuit on the basis of the corrected temperature and the operation correction data stored in the second storing means prepared for correcting a temperature characteristic of the electronic circuit.

8. The electronic compensating circuit according to claim 7, wherein said electronic circuit is an oscillator circuit for generating a reference oscillation frequency.

* * * * *